United States Patent [19]
Lur et al.

[11] Patent Number: 5,517,062
[45] Date of Patent: May 14, 1996

[54] STRESS RELEASED VLSI STRUCTURE BY THE FORMATION OF POROUS INTERMETAL LAYER

[75] Inventors: Water Lur, Taipei; J. Y. Wu, Dou-Lio, both of Taiwan

[73] Assignee: United Microelectronics Corporation, Taiwan

[21] Appl. No.: 387,432

[22] Filed: Feb. 13, 1995

Related U.S. Application Data

[62] Division of Ser. No. 83,559, Jun. 30, 1993, Pat. No. 5,393,709.

[51] Int. Cl.$^6$ ........................................... H01L 29/06
[52] U.S. Cl. ..................... 257/760; 257/644; 257/758
[58] Field of Search .................................. 257/758, 750, 257/747, 748, 178, 776, 644, 760

[56] References Cited

U.S. PATENT DOCUMENTS

| | | | |
|---|---|---|---|
| 4,654,269 | 3/1987 | Lehrer | 257/644 |
| 5,099,304 | 3/1992 | Takemura et al. | 257/647 |
| 5,119,164 | 6/1992 | Sliwa, Jr. et al. | 257/776 |
| 5,278,103 | 1/1994 | Mallon et al. | 437/240 |
| 5,302,551 | 4/1994 | Iranmanesh et al. | 437/195 |

FOREIGN PATENT DOCUMENTS 0333132  9/1989  European Pat. Off. ............... 257/760

*Primary Examiner*—Robert P. Limanek
*Assistant Examiner*—David B. Hardy
*Attorney, Agent, or Firm*—George O. Saile; Rosemary L. S. Pike

[57] ABSTRACT

A new method of forming stress releasing voids within the intermetal dielectric of an integrated circuit is achieved. A first layer of patterned metallization is provided over semiconductor device structures in and on a semiconductor substrate. A silicon oxide layer is deposited overlying the first patterned metal layer. A silicon nitride layer is deposited over the silicon oxide layer. A metal layer is deposited over the silicon nitride layer and etched to form silicon nodules on the surface of the silicon nitride layer. The silicon nitride layer is etched away to the underlying silicon oxide layer wherein the silicon nitride under the silicon nodules remains in the form of pillars. The surface of the silicon oxide layer is coated with a spin-on-glass material which is baked and cured. The silicon nodules and silicon nitride pillars are removed, leaving voids within the spin-on-glass layer. A second layer of silicon oxide is deposited overlying the spin-on-glass layer to complete formation of the porous intermetal dielectric of the said integrated circuit.

16 Claims, 3 Drawing Sheets

5,517,062

STRESS RELEASED VLSI STRUCTURE BY THE FORMATION OF POROUS INTERMETAL LAYER

RELATED PATENT APPLICATION

This application is a division of application Ser. No. 08/083,559, filed Jun. 30, 1993, now U.S. Pat. No. 5,393,709. (1) U.S. patent application Ser. No. 08/411,052 filed by Water Lur, J. T. Lin, and H. S. Liau entitled "Stress Released VLSI Structure by Void Formation."

BACKGROUND OF THE INVENTION (1) Field of the Invention

The invention relates to a method of reducing thermal stress after metallization in an integrated circuit device, and more particularly, to a method of reducing thermal stress after metallization by formation of a porous intermetal dielectric layer of an integrated circuit device.

(2) Description of the Prior Art

Conventional integrated circuit processes are designed to be void free in the layered structure before and after metal deposition to avoid the electro/stress migration of metal. For example, U.S. Pat. No. 5,099,304 to Takemura et al discloses the formation of voids in his Prior Art as being undesirable.

However, the stress inherently comes from the thermal coefficient difference of expansion between the layers. The stress in a layer can be represented by the following:

$$S_f = (a_f - a_m)(T_r - T_o) E$$

where $S_t$ is the stress of the current layer measured at room temperature, $a_f$ and $a_m$ are thermal coefficients of expansion for this layer and the substrate, respectively (substrate here is defined to be the combination of all layers, including the silicon wafer, under this layer)

$T_r$ is the temperature of the layer to be thermally treated, or the formation temperature, $T_o$ is room temperature, i.e. stress measuring temperature, and E is Young's modulus of film.

Therefore, all thermal cycles result in thermal stress in each layer as well as in all underlying layers. The stress can be up to $5 \times 10^9$ dynes/cm$^2$ or even larger. The relaxation of stress results in metal failure, dielectric cracking, and defects in the silicon substrate.

The intermetal dielectric is a critical layer in the fabrication of submicron multilevel VLSI circuits. The sandwich structure of silicon oxide and spin-on-glass is widely used to form the intermetal dielectric. Referring to FIG. 1, there is shown a portion of an integrated circuit of the conventional prior art process. Field oxide region 12 has been formed in and on semiconductor substrate 10. Device structures such as gate electrodes 14 and source/drain regions 15 have been formed. Contact or via openings are formed through an insulating layer 16 to the semiconductor substrate 10 and elsewhere as shown in FIG. 1. A first metal 20 is deposited and patterned to complete the contacts. The typical sandwich structure of silicon oxide 21, spin-on-glass 23, and silicon oxide 25 is shown. Openings are made through this intermetal dielectric sandwich 21/23/25 to the first metal layer 20. A second metallization 34 is deposited and patterned. Passivation layer 35 is deposited over the patterned metal layer. Thermal stress after metallization causes stress release-induced cracks 33 shown in FIG. 2.

U.S. Pat. No. 5,119,164 to Sliwa, Jr. et al describes a method of forming voids within a spin-on-glass layer to relieve stresses leading to cracking of the spin-on-glass layer. The present invention provides a new method of forming voids within a spin-on-glass layer.

SUMMARY OF THE INVENTION

A principal object of the present invention is to provide an effective and very manufacturable method of reducing thermal stress after metallization in an integrated circuit.

Another object of the present invention is to provide a method of reducing thermal stress by forming a porous intermetal dielectric layer in the fabrication of an integrated circuit.

In accordance with the objects of this invention a new method of forming stress releasing voids within the intermetal dielectric of an integrated circuit is achieved. A first layer of patterned metallization is provided over semiconductor device structures in and on a semiconductor substrate. A silicon oxide layer is deposited overlying the first patterned metal layer. A silicon nitride layer is deposited over the silicon oxide layer. A metal layer is deposited over the silicon nitride layer and etched to form silicon nodules on the surface of the silicon nitride layer. The silicon nitride layer is etched away to the underlying silicon oxide layer wherein the silicon nitride under the silicon nodules remains in the form of pillars. The surface of the silicon oxide layer is coated with a spin-on-glass material which is baked and cured. The silicon nodules and silicon nitride pillars are removed, leaving voids within the spin-on-glass layer. A second layer of silicon oxide is deposited overlying the spin-on-glass layer to complete formation of the porous intermetal dielectric of the said integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
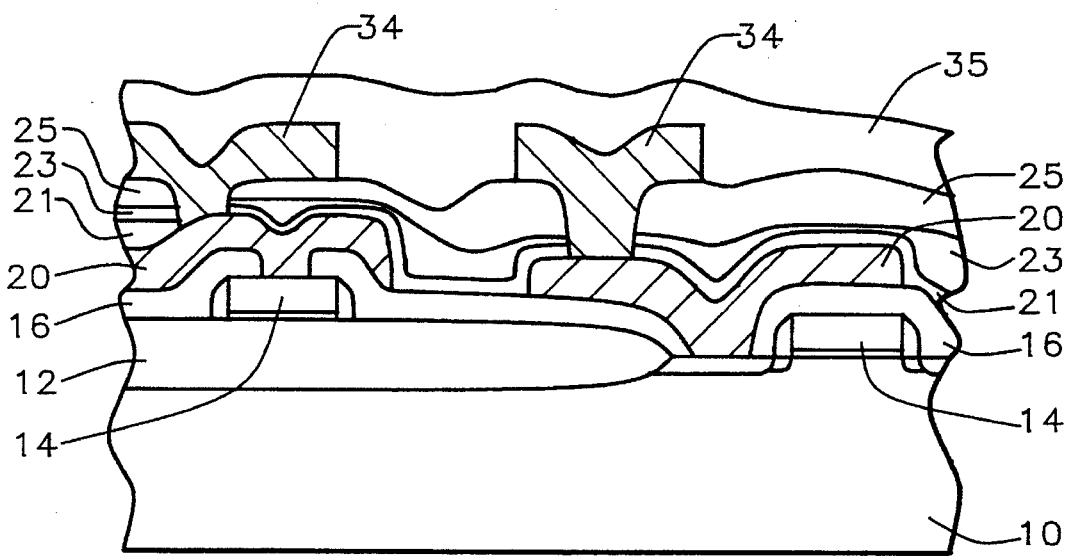
FIGS. 1 and 2 schematically illustrates in cross-sectional representation the conventional prior art process.
Figure 2:
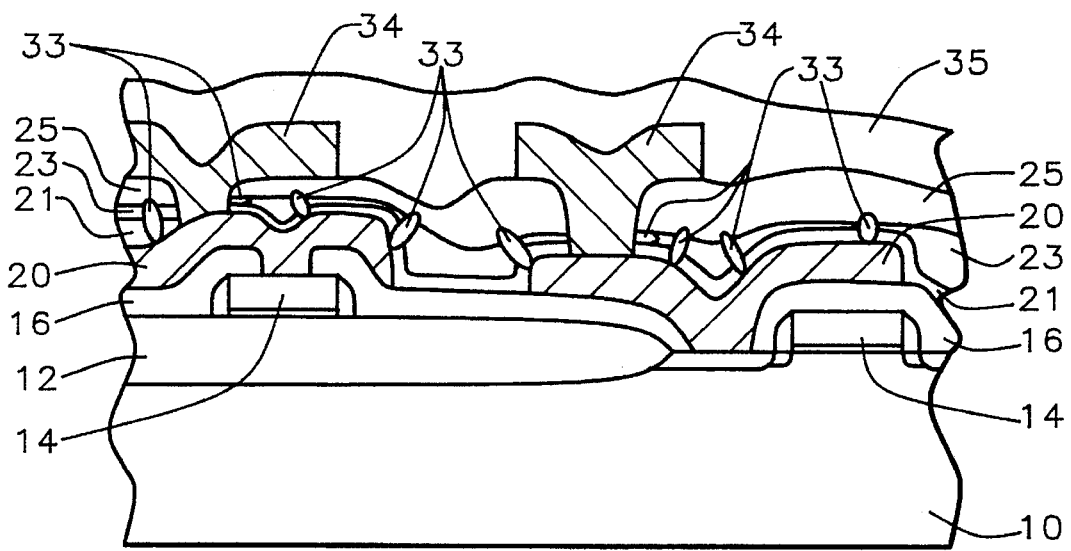
Figure 3:
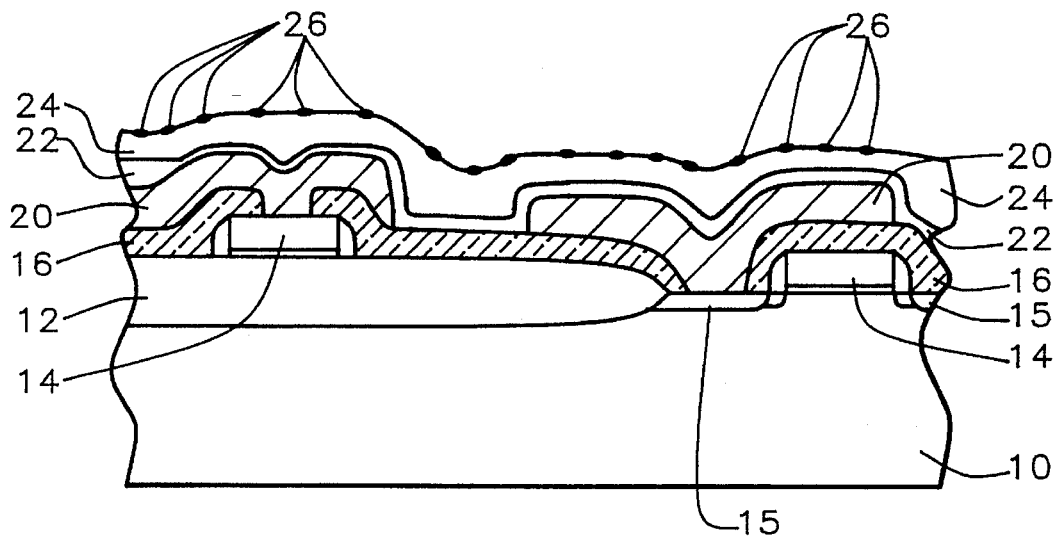
FIGS. 3 through 6 schematically illustrates in cross-sectional representation a preferred embodiment of the present invention.

Referring now more particularly to FIG. 3, the process of the present invention will be described. A portion of a partially completed integrated circuit is illustrated in FIG. 3 consisting of a semiconductor substrate 10, preferably composed of monocrystalline silicon. Field oxide region 12 has been formed in the semiconductor substrate 10. Semiconductor device structures such as gate electrodes 14 and source/drain regions 15 are formed as is conventional in the art. A passivation or insulating layer 16 is then formed over the surfaces of the patterns. This layer may be composed of multilayers such as a thin layer of silicon oxide and a much thicker layer of borophosphosilicate glass (BPSG) or phosphosilicate glass. The glasseous layer 16 is flowed as is conventional in the art to planarize the surface of the wafer.

Contact openings are formed through the insulating layer 16 to the semiconductor substrate 10 and elsewhere as illustrated in FIG. 3 using conventional lithography and etching techniques. A first metal layer 20 is deposited and patterned to complete the contacts.

Now the porous intermetal dielectric layer of the present invention is formed. The first layer 22 of the intermetal dielectric sandwich is a silicon oxide deposited by plasma enhanced chemical vapor deposition (PECVD) to a thickness of between about 1000 to 7000 Angstroms.

A layer of silicon nitride 24 is deposited on top of the silicon oxide layer 22. The silicon nitride layer is deposited by PECVD to a thickness of between about 2000 to 8000 Angstroms. Next, a metal, such as Al—Si(2%) is deposited overlying the silicon nitride layer 24. The existence of the small amount of silicon in the metal lines can prevent the aluminum from spiking into the silicon substrate via the metal contact holes. The solubility of silicon in Aluminum is less than 0.1% at room temperature. The silicon content usually precipitates during the cooling stage after deposition at high temperature or after subsequent processes. The silicon precipitates are found to distribute randomly at the Aluminum grain boundaries and at the interface of Aluminum and the underlayer. The size of the silicon precipitates depends on the initial silicon content in the Aluminum allow and the deposition conditions. If Al—Si(2%) is used and deposited at a temperature of about 300° to 400° C., the size of the silicon precipitates will be about 0.2 to 0.5 microns. It has been well known in the art that it is difficult to etch silicon during metal etching and silicon nodules are always observed thereafter. The solubility of Aluminum in Silicon is very small at room temperature and these silicon nodules are nearly pure in composition. An additional overetch step to get rid of these silicon nodules is necessary in metal etching.

The silicon nodules described above are critical to the process of the invention. The metal layer is etched using reactive ion etching (RIE) resulting in the removal of the Aluminum layer. Silicon nodules 26 remain on the surface of the silicon nitride layer.

Figure 4:
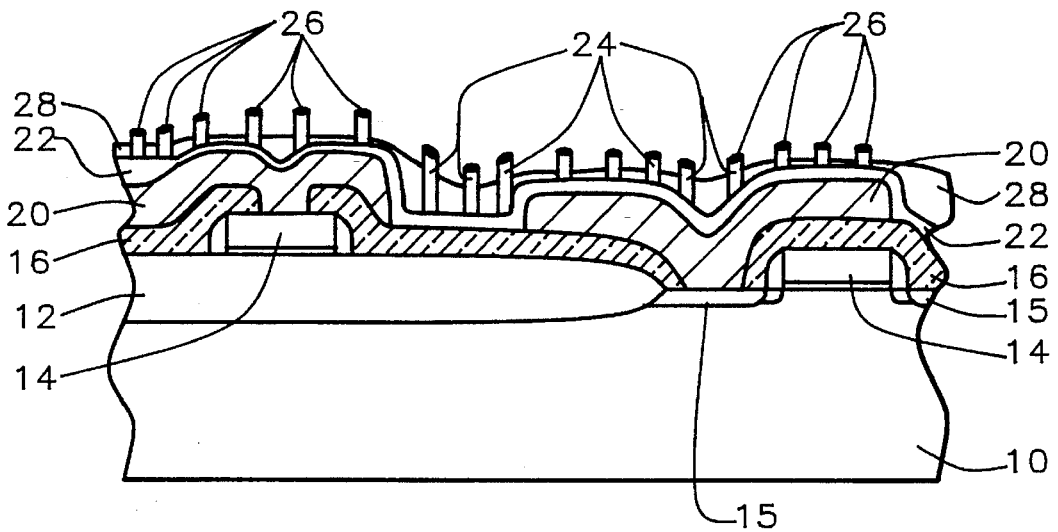

Referring now to FIG. 4, the silicon nitride layer is etched using RIE or plasma etch using $SF_6$ and He gases at a pressure of about 300 mtorr and a radio frequency power of about 150 watts. The silicon nitride layer 24 is removed except for the silicon nitride directly under the silicon nodules 26. The silicon nitride remaining is in the form of pillars 24.

A spin-on-glass coating 28 is applied. The spin-on-glass material suspended in the vehicle or solvent is deposited onto the semiconductor wafer surface and uniformly spread thereover by the action of spinning the wafer. The material fills the indentations in the integrated circuit wafer surface. The spin-on-glass material may be of silicate or siloxane type and has a thickness of between about 1000 to 5000 Angstroms.

Most of the vehicle or solvent is driven off by a low temperature baking step followed by curing. The baking and curing of the spin-on-glass are performed at temperatures of about 120° and 400° C., respectively.

Figure 5:
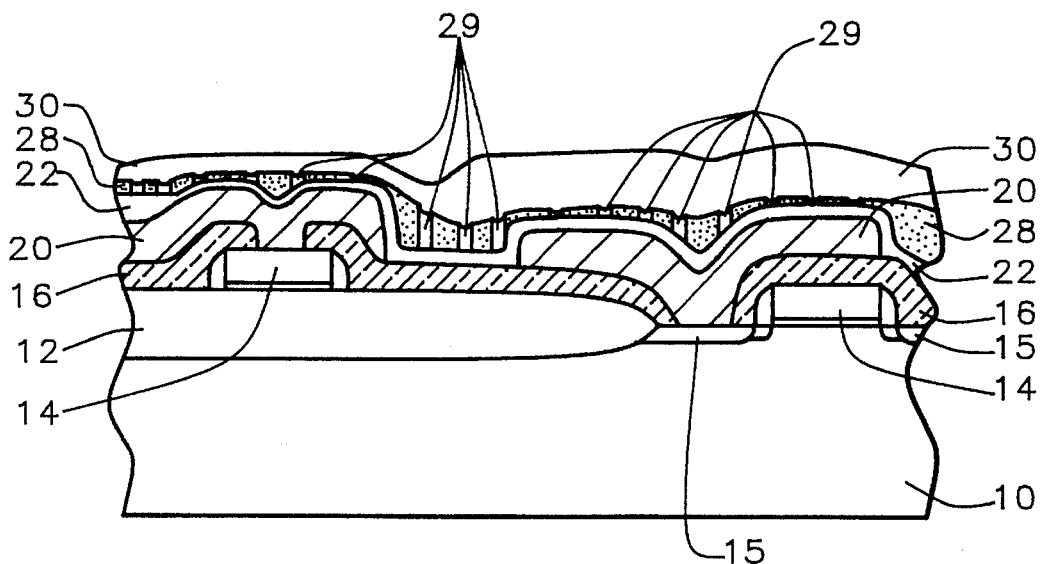

Next, the silicon nodule-capped silicon nitride pillars 24 are removed by a chemical such as phosphoric acid at a temperature of about 150° C. This removal leaves a series of vertical holes 29 within the spin-on-glass layer, as shown in FIG. 5. The final layer of the intermetal dielectric sandwich is a silicon oxide 30 deposited by PECVD to a thickness of between about 2000 to 7000 Angstroms. The size of the holes 29 is determined by the size of the silicon nodules and usually ranges from about 0.2 to 0.5 microns. The silicon oxide 30 is an undoped silicate glass which has a step coverage of less than 100%. The smaller the holes, the smaller the step coverage will be. The step coverage of the PECVD undoped silicate glass can be modified through some parameter variation, such as pressure and power, so as to form voids with the size of about 0.05 to 0.3 microns within the holes 29. This completes the formation of the porous intermetal dielectric.

Figure 6:
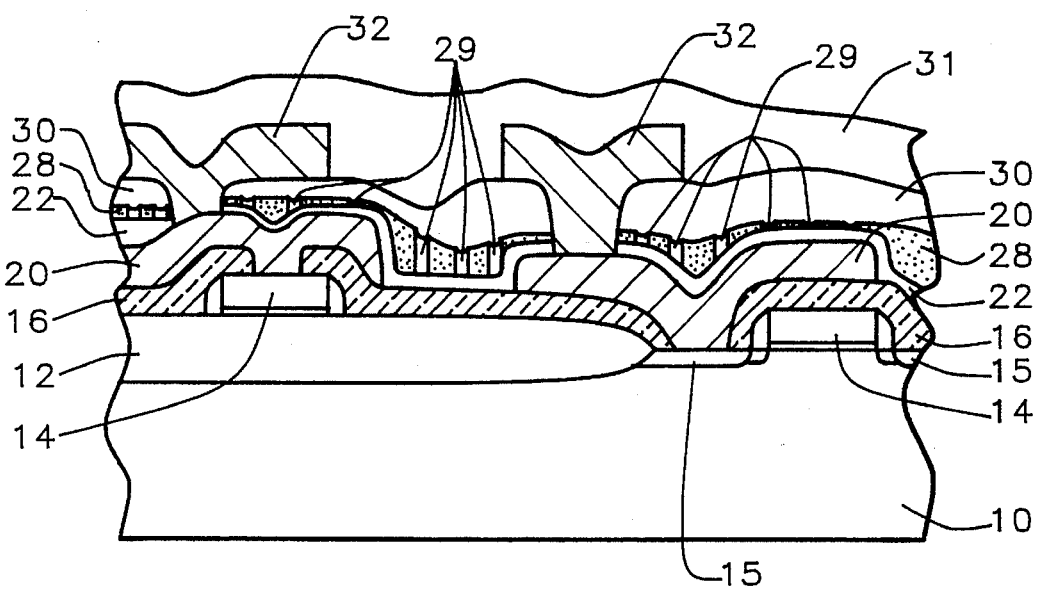

Contact or via openings are formed through the intermetal dielectric layer 22/28/30 to the first metal layer 20 using conventional lithography and etching techniques. As illustrated in FIG. 6, a second metal layer 32 is deposited and patterned to complete the second layer of metallization.

Thermal stress experienced by the integrated circuit will be released by the voids 29 within the intermetal dielectric layer. The RC constant is reduced improving the signal transient speed of the circuit. The thermal stress will be largely reduced by two to three orders of magnitude by the process of the present invention.

While the invention has been particularly shown and described with reference to the preferred embodiments thereof, it will be understood by those skilled in the art that various changes in form and details may be made without departing from the spirit and scope of the invention.

What is claimed is:

1. The stress-released integrated circuit comprising:
   at least a first patterned metallization layer over
   semiconductor device structures including gate electrodes and source and drain regions in and on a semiconductor substrate;
   a porous intermetal dielectric layer comprising:
      a first silicon oxide layer overlying said at least a first patterned metal layer;
      a spin-on-glass layer overlying said first silicon oxide layer wherein there are holes having a diameter of between about 0.2 and 0.5 micrometers within said spin-on-glass layer; and
      a second layer of silicon oxide overlying said spin-on-glass layer;
   a second patterned metal layer contacting said at least a first patterned metal layer in openings through said porous intermetal dielectric layer; and
   a top passivation layer wherein said holes within said intermetal dielectric layer release thermal stresses within said integrated circuit.

2. The integrated circuit of claim 1 wherein said holes within said porous intermetal dielectric will reduce thermal stresses experienced by said substrate by two to three orders of magnitude.

3. The integrated circuit of claim 1 wherein said first silicon oxide layer has a thickness of between about 1000 and 7000 Angstroms.

4. The integrated circuit of claim 1 wherein said spin-on-glass layer has a thickness of between about 1000 and 5000 Angstroms.

5. The integrated circuit of claim 1 wherein said second layer of silicon oxide has a thickness of between about 2000 and 7000 Angstroms.

6. The integrated circuit of claim 1 wherein said holes within said spin-on-glass layer are not filled by said second silicon oxide layer.

7. A porous intermetal dielectric layer, between layers of metallization in an integrated circuit, comprising:
   a first silicon oxide layer overlying a first layer of said layers of metallization;
   a spin-on-glass layer overlying said first silicon oxide layer wherein there are holes having a diameter of between about 0.2 and 0.5 micrometers within said spin-on-glass layer; and a second layer of silicon oxide overlying said spin-on-glass layer.

8. The porous intermetal dielectric of claim 7 wherein said first silicon oxide layer has a thickness of between about 1000 and 7000 Angstroms.

9. The porous intermetal dielectric of claim 7 wherein said spin-on-glass layer has a thickness of between about 1000 and 5000 Angstroms.

10. The porous intermetal dielectric of claim 7 wherein said second layer of silicon oxide has a thickness of between about 2000 and 7000 Angstroms.

11. The porous intermetal dielectric of claim 7 wherein said holes reduce thermal stresses experienced by said integrated circuit by two to three orders of magnitude.

12. The porous intermetal dielectric of claim 7 wherein said holes within said spin-on-glass layer are not filled by said second silicon oxide layer.

13. The stress-released integrated circuit comprising:

at least a first patterned metallization layer over semiconductor device structures including gate electrodes and source and drain regions in and on a semiconductor substrate;

a porous intermetal dielectric layer comprising:
a first silicon oxide layer overlying said at least a first patterned metal layer;
a spin-on-glass layer overlying said first silicon oxide layer wherein there are holes having a diameter of between about 0.2 and 0.5 micrometers within said spin-on-glass layer; and
a second layer of silicon oxide overlying said spin-on-glass layer wherein said holes are not filled by said second silicon oxide layer;

a second patterned metal layer contacting said at lease a first patterned metal layer in openings through said porous intermetal dielectric layer; and a top passivation layer wherein said holes within said intermetal dielectric layer release thermal stresses within said integrated circuit.

14. The integrated circuit of claim 13 wherein said first silicon oxide layer has a thickness of between about 1000 and 7000 Angstroms.

15. The integrated circuit of claim 13 wherein said spin-on-glass layer has a thickness of between about 1000 and 5000 Angstroms.

16. The integrated circuit of claim 13 wherein said second silicon oxide layer has a thickness of between about 2000 and 7000 Angstroms.

* * * * *